(12) United States Patent
Gerlach et al.

(10) Patent No.: US 11,583,896 B2
(45) Date of Patent: Feb. 21, 2023

(54) SOUND TRANSDUCER INCLUDING A PIEZOCERAMIC TRANSDUCER ELEMENT INTEGRATED IN A VIBRATORY DIAPHRAGM

(71) Applicant: Robert Bosch GmbH, Stuttgart (DE)

(72) Inventors: Andre Gerlach, Leonberg-Hoefingen (DE); Johannes Henneberg, Weil Im Schoenbuch (DE)

(73) Assignee: Robert Bosch GmbH, Stuttgart (DE)

( * ) Notice: Subject to any disclaimer, the term of this patent is extended or adjusted under 35 U.S.C. 154(b) by 719 days.

(21) Appl. No.: 16/497,933

(22) PCT Filed: Mar. 23, 2018

(86) PCT No.: PCT/EP2018/057486
§ 371 (c)(1),
(2) Date: Sep. 26, 2019

(87) PCT Pub. No.: WO2018/177945
PCT Pub. Date: Oct. 4, 2018

(65) Prior Publication Data
US 2021/0101179 A1    Apr. 8, 2021

(30) Foreign Application Priority Data
Mar. 30, 2017   (DE) .......................... 102017205375.5

(51) Int. Cl.
*B06B 1/06* (2006.01)
*H01L 41/053* (2006.01)
(Continued)

(52) U.S. Cl.
CPC .......... *B06B 1/0666* (2013.01); *B06B 1/0651* (2013.01); *G10K 11/004* (2013.01); *H01L 41/053* (2013.01); *H01L 41/23* (2013.01)

(58) Field of Classification Search
CPC .... B06B 1/0666; B06B 1/0651; H01L 41/053
(Continued)

(56) References Cited

U.S. PATENT DOCUMENTS

| | | |
|---|---|---|
| 4,725,994 A | 2/1988 | Kaneko et al. |
| 5,329,682 A | 7/1994 | Thurn et al. |

(Continued)

FOREIGN PATENT DOCUMENTS

| | | |
|---|---|---|
| CN | 101754077 A | 6/2010 |
| CN | 104285132 A | 1/2015 |

(Continued)

OTHER PUBLICATIONS

International Search Report for PCT/EP2018/057486, dated Jul. 2, 2018.

*Primary Examiner* — Derek J Rosenau
(74) *Attorney, Agent, or Firm* — Norton Rose Fulbright US LLP; Gerard Messina

(57) ABSTRACT

A sound transducer, in particular, for an ultrasonic sensor, includes a functional group, the functional group including a diaphragm cup and at least one electroacoustic transducer element. The sound transducer also includes a housing. The diaphragm cup includes a vibratory diaphragm and a circumferential wall, and at least one electroacoustic transducer element, the transducer element being configured to stimulate the diaphragm to vibrate and/or to convert vibrations of the diaphragm into electrical signals. The diaphragm cup is formed from a plastic material, the at least one transducer element being integrated into the vibratory diaphragm, in particular without an additional adhesive layer, the transducer element including a piezoceramic element.

10 Claims, 5 Drawing Sheets

(51) Int. Cl.
*G10K 11/00* (2006.01)
*H01L 41/23* (2013.01)

(58) Field of Classification Search
USPC .................................................. 310/322, 334
See application file for complete search history.

(56) References Cited

U.S. PATENT DOCUMENTS

| | | | |
|---|---|---|---|
| 2007/0035212 A1* | 2/2007 | Straub, Jr. | G01F 1/668 |
| | | | 310/348 |
| 2010/0148633 A1 | 6/2010 | Lee et al. | |
| 2012/0056511 A1* | 3/2012 | Sakai | G10K 9/122 |
| | | | 310/334 |
| 2013/0214642 A1* | 8/2013 | Lin | B06B 1/0644 |
| | | | 310/334 |
| 2015/0124564 A1 | 5/2015 | Bartylla | |

FOREIGN PATENT DOCUMENTS

| | | |
|---|---|---|
| DE | 3732412 A1 | 4/1989 |
| DE | 102007010500 A1 | 9/2008 |
| DE | 102012201884 A1 | 8/2013 |
| DE | 102012208059 A1 | 11/2013 |
| DE | 102013211533 A1 | 12/2014 |
| DE | 102013220076 A1 | 4/2015 |
| DE | 102013222076 A1 | 4/2015 |
| DE | 102015106044 A1 | 10/2016 |
| DE | 102015110939 A1 | 1/2017 |
| EP | 0477575 A1 | 4/1992 |
| JP | S5359445 A | 5/1978 |
| JP | S5359445 U | 5/1978 |
| JP | S5994493 A | 5/1984 |
| JP | S5994493 U | 6/1984 |
| JP | S6396460 A | 4/1988 |
| JP | S6396460 U | 6/1988 |
| JP | H04336799 A | 11/1992 |
| JP | H05244692 A | 9/1993 |
| JP | 2000121739 A | 4/2000 |
| JP | 2003143685 A | 5/2003 |
| JP | 2003284190 A | 10/2003 |
| JP | 2006203563 A | 8/2006 |
| JP | 2009194801 A | 8/2009 |
| JP | 2009540706 A | 11/2009 |
| JP | 2016214177 A | 12/2016 |
| WO | 2016143469 A1 | 9/2016 |

* cited by examiner

SOUND TRANSDUCER INCLUDING A PIEZOCERAMIC TRANSDUCER ELEMENT INTEGRATED IN A VIBRATORY DIAPHRAGM

FIELD OF THE INVENTION

The present invention relates to a sound transducer, including a diaphragm cup, a transducer element and a housing, the diaphragm cup includes a diaphragm and a wall.

BACKGROUND INFORMATION

Ultrasonic sensors are used in, among other things, automobile applications and industrial applications for detecting the surroundings. Objects in the surroundings may be detected by the ultrasonic sensor emitting an ultrasonic signal and the ultrasonic echo reflected by an object being received again. The distance to the object may then be calculated based on the propagation time between the emission of the ultrasonic signal and the reception of the ultrasonic echo, and on the known sound velocity.

The ultrasonic sensors may include a sound transducer, including a diaphragm, a transducer element and a housing. The transducer element is a piezoceramic element, for example, which causes the diaphragm to vibrate after a voltage is applied or, to receive ultrasonic echoes, converts the vibrations induced by sound pressure in front of the diaphragm into an electrical signal. Such sound transducers are in the related art, see for example DE 10 2012 201 884 A1.

The piezoceramic element and the diaphragm floor are usually connected via an adhesive process. This process is prone to failure both during the manufacturing process as well as during operation. The functional group of the ultrasonic sensor and the housing are fabricated as separate individual parts and subsequently joined.

Patent document DE 10 2013 220 076 A1 discusses a sound transducer, which includes a resonator having at least one piezoelectric element. The resonator is configured as one piece as a diaphragm cup that includes a diaphragm and a circumferential shell surface made of the same material. The diaphragm cup is manufactured, for example, from a polymer material such as polyvinylidene fluoride (PVDF) or from a piezoceramic material. One or multiple areas of the diaphragm are polarized so that piezoelectrically active areas are formed.

Based on the foregoing, the object of the present invention is to specify a sound transducer including a simplified manufacturing process and a simplified structure.

SUMMARY OF THE INVENTION

According to the present invention, a sound transducer is provided, in particular, for an ultrasonic sensor.

The sound transducer includes a functional group, the functional group encompassing a diaphragm cup and at least one electroacoustic transducer element. The sound transducer also includes a housing 5. The diaphragm cup encompasses a vibratory diaphragm and a circumferential wall, as well as at least one electroacoustic transducer element, the transducer element being configured to induce the diaphragm to vibrate and/or to convert vibrations of the diaphragm into electrical signals. The diaphragm cup is formed from a plastic material, the at least one transducer element being integrated according to the present invention into the vibratory diaphragm, in particular, without an additional adhesive layer, the transducer element being configured as a piezoceramic element.

The transducer element includes electrodes on one or multiple surfaces for contacting and activation. These may be configured as electrically conductive layers.

A transducer element integrated into the vibratory diaphragm is understood in this case to mean that the transducer element is present initially as a separate component, which is connected to the vibratory diaphragm during the forming of the vibratory diaphragm, for example, via an injection molding method or a resin transfer molding method, in such a way that the plastic material of the diaphragm surrounds at least partially the transducer element.

A duroplast, or alternatively a thermoplast may be used as the plastic material of the diaphragm cup, including the vibratory diaphragm. Epoxy resins are particularly suited as plastic materials.

The electro-mechanical conversion is made possible by the integration of the transducer element configured as a piezoceramic element into the vibratory diaphragm of the sound transducer. The sensor thus formed may be used both for receiving as well as for transmitting sound, in particular, ultrasound. The configuration of a particular, desired mode of vibration and vibrational frequency may be achieved by the geometric configuration in the diaphragm. For this purpose, areas of the diaphragm may be formed, for example, having a different thickness or material strength. Normal operating frequencies are in the range between 20 kHz and 250 kHz, particularly well suited are frequencies in the range of 30 kHz to 80 kHz. The vibratory diaphragm may include, in particular, areas having a reduced thickness and/or areas having an increased thickness. The diaphragm in this case may include a thickness or material strength in the range of 0.15 mm to 5 mm, particularly of 0.2 mm to 1 mm.

As a result of the distance of the piezoceramic element to the mechanically neutral fiber of the diaphragm cup (i.e., to the area of the component in which no tensile stresses, compressive stresses or shear stresses occur under a bending load, also referred to as "zero line"), a high mechanical deformation of the piezoceramic occurs and a maximum electro-mechanical conversion effect may thus be achieved.

A sound transducer configured according to the present invention has, in particular, the advantage that the manufacturing costs are significantly reduced as a result of the reduction of the number of components as compared to the related art. Furthermore, an error-prone adhesive connection for coupling a separate electroacoustic or electromechanical transducer element to the vibratory diaphragm may be dispensed with during manufacturing. This further simplifies the construction process. A subsequent polarizing of only one particular area of the vibratory diaphragm for forming a transducer element, as is known from the related art, is also avoided.

Sound transducers configured according to the present invention may thus be advantageously used in sensors for determining distances, for example, with the aid of air ultrasound. A use for determining distances in liquids is also conceivable. Because of the one piece configuration and the resultant robustness with respect to environmental influences, sound transducers configured according to the present invention are particularly suited for use in the automobile.

In one particular embodiment of the present invention, the housing and the functional group of the sound transducer are configured as one piece, or as one component.

A sound transducer configured according to the present invention may include, in particular, one or multiple electrical conductors for electrical contacting, the transducer element or the multiple transducer elements being contacted by the electrical conductor or electrical conductors. By applying electrical signals to these conductors, it is possible to induce vibrations of the transducer element in a known manner, which are conveyed to the diaphragm and result in the emission of acoustic signals, in particular, ultrasonic signals, by the sound transducer (transmit mode of the sound transducer). Incident sound waves may also induce the diaphragm to vibrate, as a result of which an electrical voltage signal is generated in the transducer element, which is tapped by the conductors (receive mode of the sound transducer). To generate the electrical signals for stimulating the diaphragm during the transmit mode and/or for evaluating voltage signals generated in the transducer element during the receive mode as a result of incident sound waves, the conductors may be electrically connected, for example, with the aid of a plug connection, to a control unit configured for generating and/or for evaluating the signals.

In one embodiment of the present invention, at least one transducer element has a disk-shaped configuration and includes a first surface and a second surface opposite the first surface. The transducer element is integrated into the diaphragm in such a way that the second surface is exposed in the direction of the interior of the diaphragm cup.

This embodiment offers the advantage that as a result of the inwardly exposed second surface of the transducer element, the transducer element may be electrically contacted in a simple manner. At least one electrical conductor in this embodiment may be contacted directly on the exposed second surface.

The piezoceramic element in this embodiment may be configured in such a way that both electrodes may be electrically contacted from the same side, i.e., of the same surface. For this purpose, the piezoceramic element includes, in particular, a peripheral contact. In this case, the electrode on the first surface connected to the diaphragm has a full-surface configuration and is guided over the edge of the piezoceramic element onto the second surface, where it forms a contact surface.

In one alternative embodiment of the present invention, at least one transducer element has a disk-shaped configuration and includes a first surface and a second surface opposite the first surface. The transducer element in this case may be integrated into the diaphragm in such a way that the first surface is exposed in the emission direction of the diaphragm cup. The emission direction in this case is understood to mean the direction perpendicular to the extension of the diaphragm, in which a sound signal may be emitted when the diaphragm is induced to mechanically vibrate. This arrangement of the transducer element has the advantage of a direct coupling of the piezoelectric element to the surrounding fluid. This represents an advantage, in particular, in the case of high-density fluids. The contacting in this embodiment may take place via a peripheral contact on an opposite second surface.

According to a second aspect of the present invention, a possible manufacturing method is specified for a sound transducer configured according to the present invention with the aid of injection molding or resin transfer molding. The method includes, in particular, the following steps:

a) at least one transducer element configured as a piezoceramic element is introduced into a cavity of a plastic processing tool, b) a plastic material is injected into the cavity, the transducer element being at least partially enclosed by the plastic material, as a result of which a diaphragm cup is formed including a vibratory diaphragm and a wall, the at least one transducer element being integrated into the vibratory diaphragm.

The method steps a) and b) according to the present invention need not necessarily be carried out in this order. Thus, it is also possible within the scope of the present invention that plastic material is first injected into the cavity and chronologically thereafter at least one transducer element configured as a piezoceramic element is introduced into a cavity of a plastic processing tool. However, the piezoceramic element may be initially introduced into the cavity and the plastic material is subsequently injected.

The piezoceramic element may be electrically contacted, in particular, before the introduction of the plastic processing tool into the cavity, for example, with the aid of soldering, bonding or thermocompression welding of pins, wires or other electric conductors. The electrical contacts in this case are protected via suitable sealing measures prior to the wetting with plastic, to enable subsequent electrical terminals.

The manufacturing method according to the present invention enables the simple and economical manufacturing of a sound transducer, for example, for an ultrasonic sensor, on the basis of piezoceramic elements integrated as transducer elements into the diaphragm. As a result, an error-prone adhesive bond for coupling an electroacoustic or electromechanical transducer element may be dispensed with during manufacturing, thus resulting in a simplified construction process. Since the plastic material in the liquid state wets the piezoceramic element and subsequently cures, the result is a reliable adhesion between the plastic material and the piezoceramic element, which represents the transducer element of the sound transducer thus manufactured. This reliable adhesion results in a high reproducibility of the mechanical vibration properties of the sound transducer. Since moreover, for example in their adhesive layer thickness, adhesive properties or the profile of the adhesive layer by the application of a tolerance-tainted adhesive partner, no adhesive layers are necessary, the robustness and the reproducibility of the mechanical vibration properties of the sound transducer are further enhanced.

In one embodiment of the present invention, the cavity of the plastic processing tool is configured in such a way that in step b), the functional group is configured together with a housing of the sound transducer as one piece. The one-piece configuration yields, in particular, the advantages that the finished component exhibits an increased robustness with respect to environmental influences such as, for example, the penetration of moisture or contaminants, and that also the number of components of the sound transducer and the number of the required working steps for assembling the sound transducer decrease.

BRIEF DESCRIPTION OF THE DRAWINGS

FIG. 1 b) shows enlarged the functional group of the sound transducer according to FIG. 1 a).

FIG. 3 b) shows enlarged the functional group of the sound transducer according to FIG. 3 a).

DETAILED DESCRIPTION OF THE INVENTION

Figure 1:
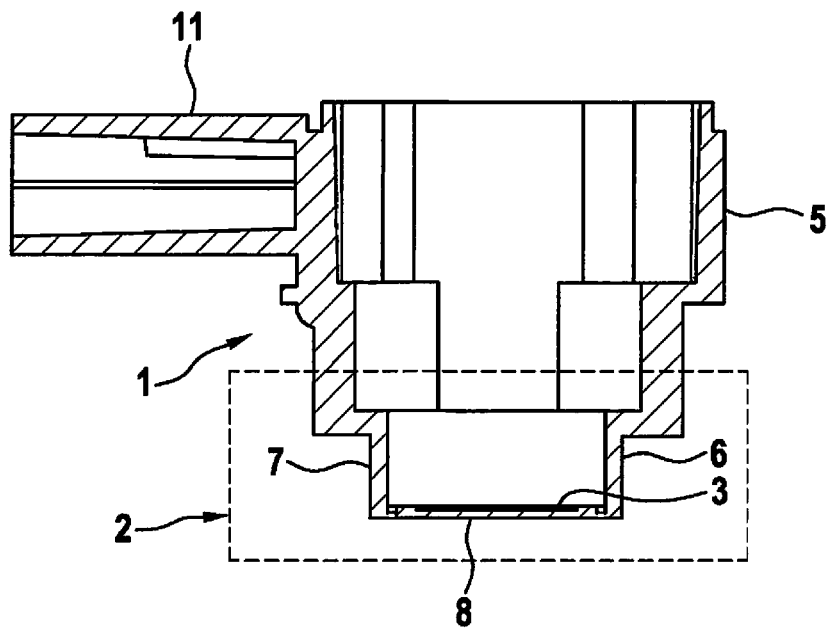
FIG. 1 a) schematically shows a sound transducer according to a first embodiment of the present invention.
Figure 1:
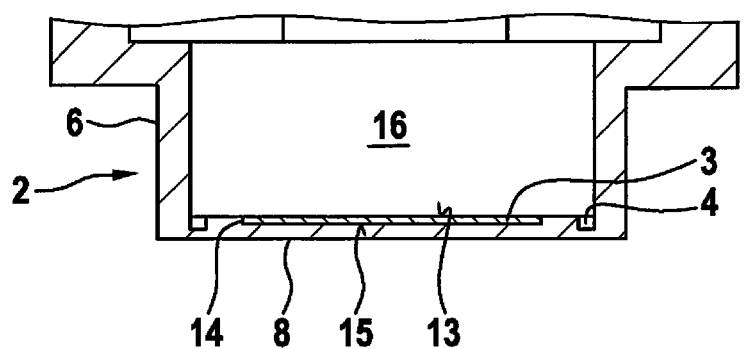

In the following description of the exemplary embodiments of the present invention, identical elements are identified with identical reference numerals, a repeated description of these elements being dispensed with if necessary. The figures represent only schematically the subject matter of the present invention.

A section through a sound transducer 1 according to a first embodiment of the present invention is depicted in FIG. 1 a). The sound transducer includes a housing 5 including a plug housing 11. The sound transducer includes a functional group 2, which is configured together with the housing as one piece. The functional group includes a diaphragm cup 6 including a vibratory diaphragm 8 and a circumferential wall 7. Diaphragm 8 may, for example, have a circular or elliptical shape. The diaphragm includes areas 4 having a reduced wall thickness. The vibrational behavior, as well as the resonance frequency of the sound transducer, is determined by the geometric configuration of these areas. Diaphragm cup 6 in this example is configured as one piece. In addition, the circumferential wall 7 transitions directly into housing 5, the plug housing 11 also being configured together with housing 5 as one piece. Sound transducer 1 further includes a transducer element 3 which, according to the present invention, is configured as a piezoceramic element and is integrated into vibratory diaphragm 8.

Functional group 2 of sound transducer 1 according to the first exemplary embodiment is depicted enlarged in FIG. 1 b). Transducer element 3 in this example is configured as a disk having a first surface 15, a second surface 13 opposite the first surface and a circumferential lateral surface 14.

Transducer element 3 is integrated into the diaphragm in such a way that second surface 13 is exposed in the direction of interior 16 of diaphragm cup 6. In this case, the transducer element is integrated into diaphragm 8 in such a way that both first surface 15 as well as lateral surface 14 of transducer element 3 are completely enclosed by the plastic material of diaphragm 8 in such a way that second surface 13 fits flush with the diaphragm. Transducer element 3 configured as a piezoceramic element in this embodiment is configured in such a way that both electrodes may be electrically contacted from the same side, i.e., of the same surface.

Figure 5:
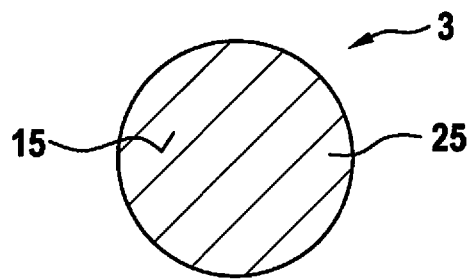
FIGS. 5 a), 5 b) and 5 c) show various enlarged views of a possible embodiment of a transducer element for a sound transducer according to one of the exemplary embodiments of the present invention shown in FIGS. 1 through 4.
Figure 5:
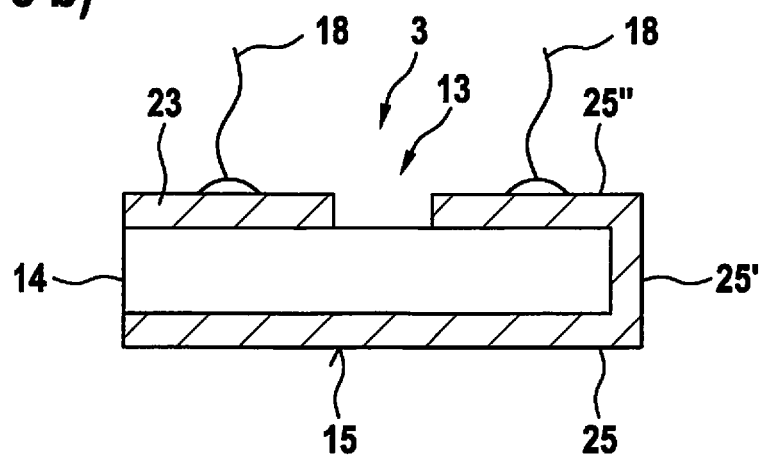
Figure 5:
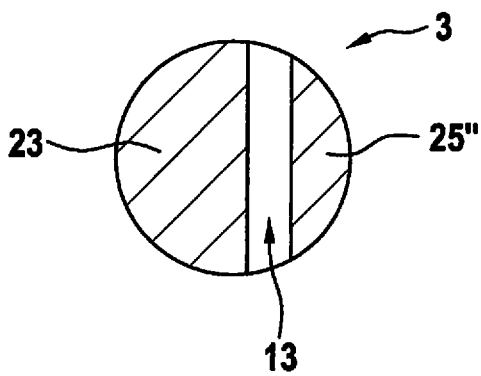

This is schematically depicted enlarged once again in FIG. 5. FIG. 5 a) shows transducer element 3 in a top view of first surface 15. FIG. 5 b) shows a section through transducer element 3. FIG. 5 c) shows transducer element 3 configured as a piezoceramic element in a top view of second surface 13.

First surface 15 of transducer element 3 is covered in this example with a full-surface electrode layer 25. Transducer element 3 includes a peripheral contact 25' across lateral surface 14, with the aid of which first electrode 25 is guided over the edge of the piezoceramic element onto second surface 13, where it forms a contact surface 25". A second electrode 23 is formed on second surface 13 electrically separate from contact surface 25". Electrical conductors 18 for activating transducer element 3 are contacted on contact surface 25" and on second electrode 23, for example, via soldering or bonding.

Figure 2:
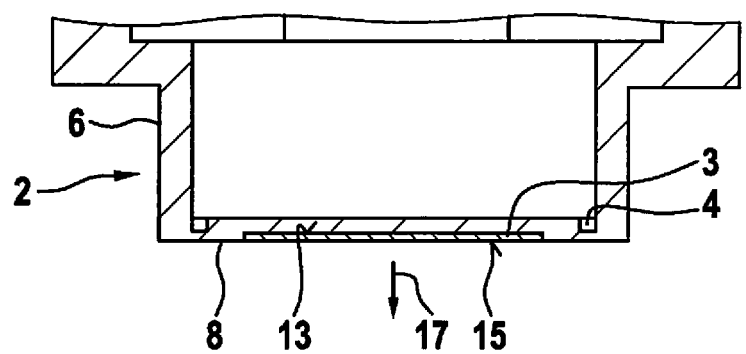
FIG. 2 schematically shows a functional group of a sound transducer according to a second embodiment of the present invention.

Functional group 2 of a sound transducer 1 according to a second exemplary embodiment of the present invention is depicted enlarged in FIG. 2. Transducer element 3 in this example is configured as a disk having a first surface 15 and a second surface 13 opposite the first surface. Transducer element 3 is integrated into the diaphragm in such a way that first surface 15 is exposed in the emission direction 17 of sound transducer 1. The electrodes for contacting the transducer element in this case may be configured in the same way or in an equivalent way, as is depicted in conjunction with FIG. 5. For this purpose, the electrical conductors, for example, wires or pins (not depicted) may, for example, be fed through the plastic material of diaphragm 8.

Figure 3:
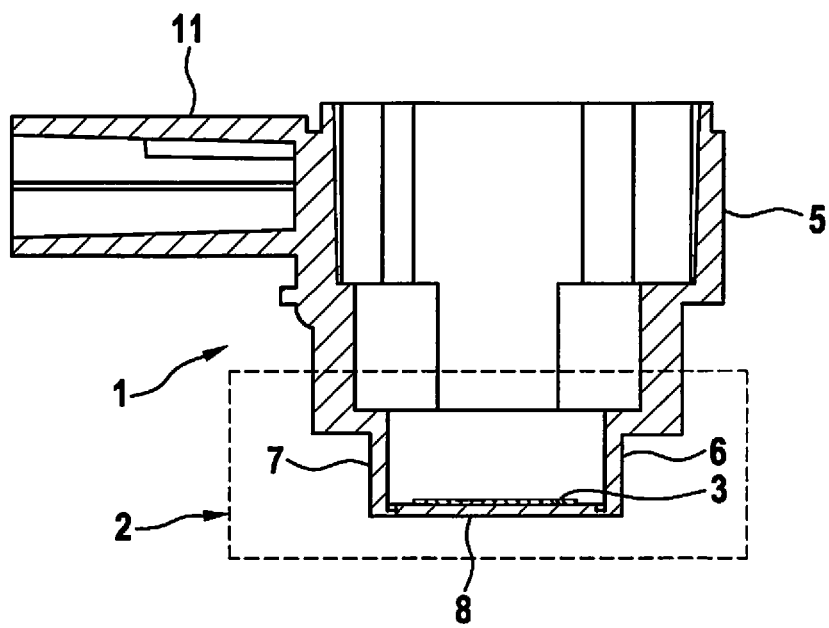
FIG. 3 a) schematically shows a sound transducer according to a third embodiment of the present invention.
Figure 3:
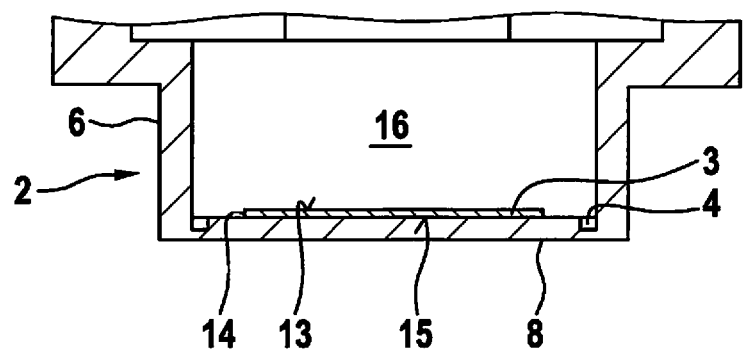

A section through a sound transducer 1 according to a third embodiment of the present invention is schematically depicted in FIG. 3 a). The sound transducer again includes a housing 5 having a plug housing 11. The sound transducer includes a functional group 2, which is configured together with the housing as one piece. The functional group includes a diaphragm cup 6 having a vibratory diaphragm 8 and a circumferential wall 7. Sound transducer 1 further includes a transducer element 3, which is configured according to the present invention as a piezoceramic element and is integrated into vibratory diaphragm 8.

The functional group 2 of sound transducer 1 according to the third exemplary embodiment is depicted enlarged in FIG. 3 b). Transducer element 3 is also configured in this example as a disk having a first surface 15, a second surface 13 opposite the first surface and a circumferential wall 14. Transducer element 3 is integrated into the diaphragm in such a way that second surface 13 is exposed in the direction of interior 16 of diaphragm cup 6. In this case, lateral surface 14 is enclosed only partially or not at all by the plastic material of diaphragm 8. This yields potential advantages for the manufacturing process. The piezoceramic element to be integrated is easier to place and to fix in the cavity. In addition, this arrangement results in an enlarged distance of the transducer element to the neutral fiber (zero line).

Figure 4:
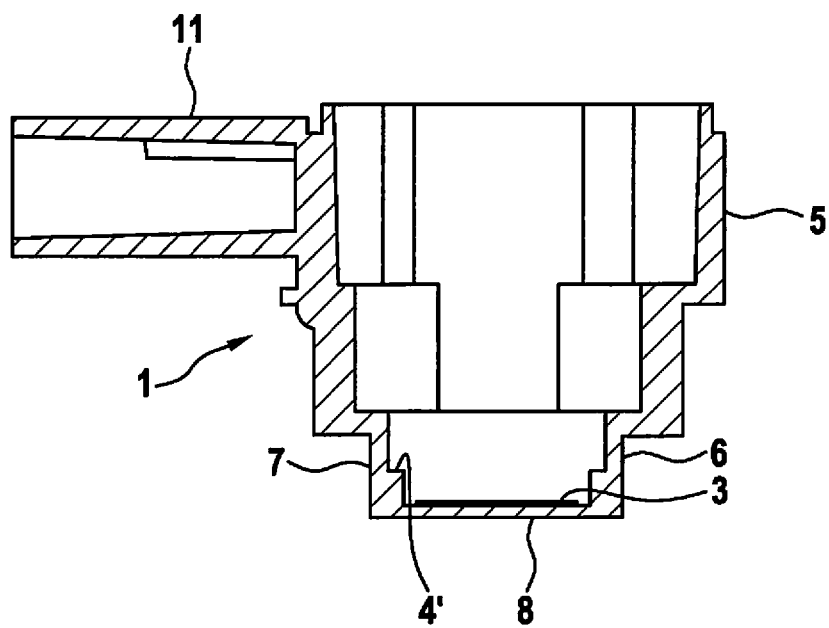
FIG. 4 schematically shows a sound transducer according to a fourth embodiment of the present invention.

A section through a sound transducer 1 according to an exemplary fourth embodiment of the present invention is schematically depicted in FIG. 4. The structure of sound transducer 1 according to the fourth embodiment of the present invention corresponds essentially to the structure of the sound transducer according to the third embodiment of the present invention described in conjunction with FIG. 3. The only difference is that according to the fourth embodiment of the present invention, areas 4' of the diaphragm exhibit an increased thickness (material accumulation). As a result of the configuration of areas 4', it is possible to adapt the resonance frequency of the sound transducer and the directional characteristic of the sound transducer. Areas 4' in this case may be situated evenly (symmetrically) or unevenly (asymmetrically).

Figure 6:
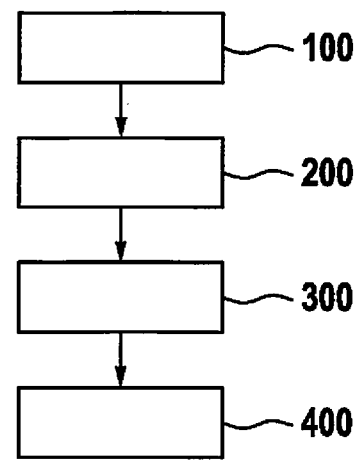
FIG. 6 schematically shows a flow chart of a possible embodiment of a method according to the present invention.

FIG. 6 illustrates the sequence of a manufacturing method according to the present invention for a functional group of a sound transducer according to the present invention.

In step 100, a plastic processing tool that includes a cavity is provided, the shape of which is adapted to the desired shape of the sound transducer.

In step 200, a piezoceramic element, which is provided as a transducer element, is introduced into the cavity. Electrical conductors may already optionally be provided, which contact the electrodes of the piezoceramic element.

In step 300, a plastic material, for example, an epoxy resin, is injected into the cavity, via which at least the functional group of the sound transducer is formed and via which the piezoceramic element is at least partially enclosed by the plastic material. If the cavity is appropriately configured, not only the functional group of the sound transducer, but also the housing may be formed as one component.

In step 400, the functional group or the component including the functional group and the housing of the sound transducer are removed, if necessary, after a period of solidification.

What is claimed is:

1. A sound transducer, comprising:
   a functional group, which includes a diaphragm cup and at least one electroacoustic transducer element; and
   a housing;
   wherein the diaphragm cup includes a vibratory diaphragm and a wall, the transducer element being configured to induce the diaphragm to vibrate and/or to convert vibrations of the diaphragm into electrical signals and, at least the diaphragm cup being formed from a plastic material, and
   wherein the at least one transducer element is integrated into the vibratory diaphragm, the transducer element including a piezoceramic element,
   wherein the at least one transducer element includes a first surface and a second surface opposite the first surface, the transducer element being integrated into the diaphragm so that the second surface is exposed in the direction of the interior of the diaphragm cup,
   wherein the transducer element is integrated into the diaphragm such that both the first surface and a circumferential lateral surface of the transducer element are completely enclosed by the plastic material of the diaphragm cup and wherein the second surface fits flush with the diaphragm.

2. The sound transducer of claim 1, wherein the at least one transducer element is integrated without an additional adhesive layer into the vibratory diaphragm.

3. The sound transducer of claim 1, wherein at least one transducer element has a disk-shaped design.

4. The sound transducer of claim 1, wherein at least one transducer element has an essentially disk-shaped configuration and includes a first surface and a second surface opposite the first surface, the transducer element being integrated into the diaphragm so that the first surface is exposed in an emission direction of the diaphragm cup.

5. The sound transducer of claim 1, wherein the sound transducer includes electrical conductors, the transducer element including electrodes, which are contacted by the electrical conductors.

6. The sound transducer of claim 5, wherein a first electrode is formed on a first surface of the transducer element and a second electrode is formed on a second surface of the transducer element opposite the first surface.

7. The sound transducer of claim 6, wherein the transducer element includes a peripheral contact, the first electrode being guided via the peripheral contact over an edge of the transducer element and onto the second surface, where it forms a contact surface.

8. The sound transducer of claim 1, wherein the housing and the functional group are configured as one piece.

9. The sound transducer of claim 1, wherein the vibratory diaphragm includes areas having a reduced thickness and/or areas having an increased thickness.

10. An ultrasonic sensor, comprising:
    a sound transducer, including:
       a functional group, which includes a diaphragm cup and at least one electroacoustic transducer element; and
       a housing;
       wherein the diaphragm cup includes a vibratory diaphragm and a wall, the transducer element being configured to induce the diaphragm to vibrate and/or to convert vibrations of the diaphragm into electrical signals and, at least the diaphragm cup being formed from a plastic material, and
       wherein the at least one transducer element is integrated into the vibratory diaphragm, the transducer element including a piezoceramic element;
    wherein the sound transducer includes the functional group, which includes the diaphragm cup and the at least one electroacoustic transducer element, and the housing,
    wherein the at least one transducer element includes a first surface and a second surface opposite the first surface, the transducer element being integrated into the diaphragm so that the second surface is exposed in the direction of the interior of the diaphragm cup,
    wherein the transducer element is integrated into the diaphragm such that both the first surface and a circumferential lateral surface of the transducer element are completely enclosed by the plastic material of the diaphragm cup and wherein the second surface fits flush with the diaphragm.

\* \* \* \* \*